(12) United States Patent
Masleid

(10) Patent No.: US 7,667,288 B2
(45) Date of Patent: Feb. 23, 2010

(54) SYSTEMS AND METHODS FOR VOLTAGE DISTRIBUTION VIA EPITAXIAL LAYERS

(76) Inventor: Robert P. Masleid, 17266 Eaton La., Monte Sereno, CA (US) 95930

( * ) Notice: Subject to any disclaimer, the term of this patent is extended or adjusted under 35 U.S.C. 154(b) by 0 days.

(21) Appl. No.: 10/990,885

(22) Filed: Nov. 16, 2004

(65) Prior Publication Data
US 2006/0102960 A1 May 18, 2006

(51) Int. Cl.
H01L 23/62 (2006.01)
(52) U.S. Cl. .............. 257/509; 257/E29.013; 257/371; 257/549; 257/372; 257/373
(58) Field of Classification Search .......... 257/371, 257/372, 373, 375, 376, 549, 548, 550, 509, 257/E29.013; 438/208, 220, 223, 224, 227, 438/228
See application file for complete search history.

(56) References Cited

U.S. PATENT DOCUMENTS

| 3,581,165 | A | * | 5/1971 | Seelbach et al. ............ 257/544 |
| 3,772,097 | A | | 11/1973 | Davis |
| 5,119,162 | A | | 6/1992 | Todd et al. |
| 5,256,582 | A | | 10/1993 | Mosher et al. |
| 5,623,159 | A | | 4/1997 | Monk et al. |
| 5,719,733 | A | * | 2/1998 | Wei et al. ...................... 361/56 |
| 6,507,080 | B2 | * | 1/2003 | Jang et al. ................... 257/409 |
| 6,664,608 | B1 | * | 12/2003 | Burr ............................ 257/549 |
| 6,936,898 | B2 | | 8/2005 | Pelham et al. .............. 257/371 |
| 7,015,741 | B2 | | 3/2006 | Tschanz et al. ............. 327/295 |
| 2003/0146476 | A1 | | 8/2003 | Kaneko et al. |
| 2004/0053439 | A1 | | 3/2004 | Schafbauer et al. |
| 2004/0219733 | A1 | | 11/2004 | Algotsson et al. |

FOREIGN PATENT DOCUMENTS

EP 0 422 250 A 4/1991
EP 0 424 926 A 5/1991

OTHER PUBLICATIONS

Chandrakasan A., Bowhill W., Fox F. "Design of High-Performance Microprocessor Circuits", 2001 by the Institute of Electrical and Electronics Engineers, Inc. 3 Park Avenue, 17th Floor, New York, NY 10016-5997.

* cited by examiner

Primary Examiner—Thao X Le
Assistant Examiner—Ajay K Arora

(57) ABSTRACT

Systems and methods for voltage distribution via epitaxial layers. In accordance with a first embodiment of the present invention, an integrated circuit comprises an epitaxial layer of a connectivity type disposed upon a wafer substrate of an opposite connectivity type.

11 Claims, 2 Drawing Sheets

SYSTEMS AND METHODS FOR VOLTAGE DISTRIBUTION VIA EPITAXIAL LAYERS

RELATED APPLICATION

Co-pending commonly-owned U.S. patent application Ser. No. 10/334,272 filed Dec. 31, 2002, entitled "Diagonal Deep Well Region for Routing Body-Bias Voltage for MOSFETs in Surface Well Regions" to Pelham and Burr, is hereby incorporated herein by reference in its entirety as reference material.

FIELD OF THE INVENTION

Embodiments in accordance with the present invention relate to systems and methods for voltage distribution in an integrated circuit device via epitaxial layers.

BACKGROUND

It is desirable to distribute voltages, for example, body biasing voltages, within an integrated circuit.

SUMMARY OF THE INVENTION

Therefore, systems and methods for voltage distribution in an integrated circuit device via epitaxial layers would be highly desirable.

Accordingly, systems and methods for voltage distribution via epitaxial layers are disclosed. In accordance with a first embodiment of the present invention, an integrated circuit comprises an epitaxial layer of a connectivity type disposed upon a wafer substrate of an opposite connectivity type.

In accordance with another embodiment of the present invention, an integrated circuit comprises an epitaxial layer for conducting a voltage substantially parallel to a plane of the epitaxial layer.

In accordance with still another embodiment of the present invention, an integrated circuit comprises a first plurality of field effect transistors formed in an epitaxial layer of a connectivity type. The integrated circuit further comprises a second plurality of field effect transistors formed in a well of an opposite connectivity type, the well is disposed within the epitaxial layer. The integrated circuit also comprises a layer of the opposite connectivity type disposed beneath the epitaxial layer. In one embodiment, the layer of the opposite connectivity type is for coupling a body biasing voltage to the second plurality of field effect transistors.

DETAILED DESCRIPTION OF THE INVENTION

In the following detailed description of the present invention, systems and methods for voltage distribution via epitaxial layers, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Systems and Methods for Voltage Distribution Via Epitaxial Layers

Embodiments in accordance with the present invention are described in the context of design and operation of integrated semiconductors. More particularly, embodiments of the present invention relate to systems and methods for voltage distribution via epitaxial layers. It is appreciated, however, that elements of the present invention may be utilized in other areas of semiconductor operation.

The following description of embodiments in accordance with the present invention is directed toward coupling a body-bias voltage to pFETs (or p-type field effect transistors) formed in surface N-wells and/or to nFETs (or n-type field effect transistors) formed in P-epitaxy when an N-well process is utilized. It is to be appreciated, however, that embodiments in accordance with the present invention are equally applicable to coupling a body-bias voltage to nFETs (or n-type field effect transistors) formed in surface P-wells and/or to pFETs (or p-type field effect transistors) formed in surface N-epitaxy when a P-well process is utilized. Consequently, embodiments in accordance with the present invention are well suited to semiconductors formed in both p-type and n-type materials, and such embodiments are considered within the scope of the present invention.

Figure 1:
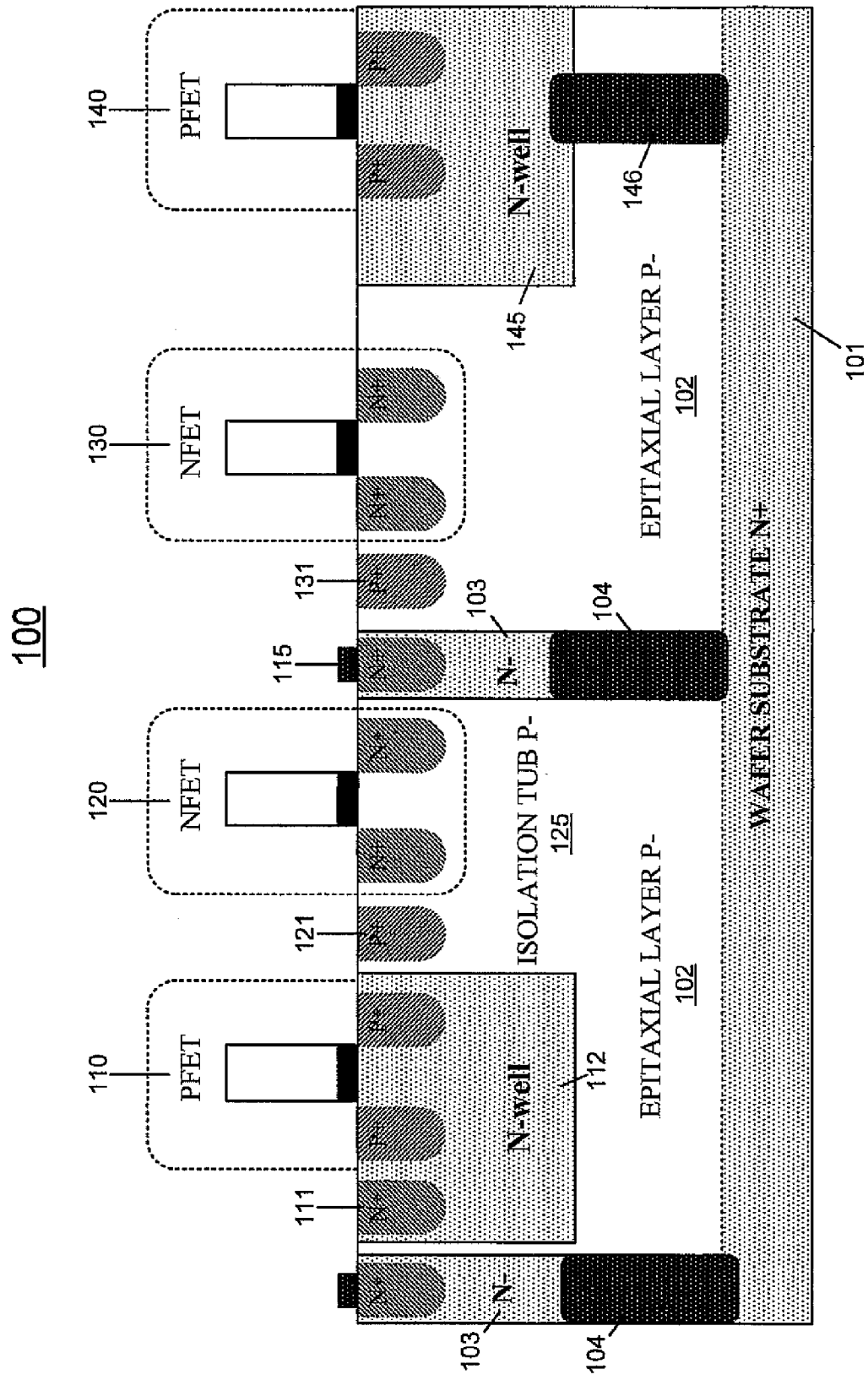
FIG. 1 illustrates a side sectional view of a portion of integrated circuit, in accordance with embodiments of the present invention.

FIG. 1 illustrates a side sectional view of a portion of integrated circuit 100, in accordance with embodiments of the present invention. Integrated circuit 100 comprises a wafer substrate 101, typically of N+ type material, and at least one epitaxy layer 102 of P– type material. It is to be appreciated that generally an epitaxial layer of a first conduction type, e.g., p-type material, is not conventionally disposed on a substrate of a second conduction type, e.g., n-type material.

N-type well diffusion 103 forms a continuous "guard ring" or wall forming an outside border of isolation tub 125. It is to be appreciated that embodiments in accordance with the present invention are well suited to a variety of shapes of a wall structure (as would be seen in plan view) for n-type well diffusion 103. For example, a plan view of n-type well diffusion 103 can be rectangular, have curving features, e.g., be convex or non-convex, and/or comprise a variety of other closed shapes, including self-intersecting shapes.

Conventional isolation tubs are known to be completed by a deep n-well layer or plate underlying and coupled to such a guard ring, forming a bottom of an isolation structure or tub. In contrast, wafer substrate 101 forms the bottom of isolation tub 125. Segments of deep n-well 104 are disposed beneath n-type well diffusion 103 coupling n-type well diffusion 103 to wafer substrate 101. Deep n-well 104 forms a continuous "guard ring" or wall that generally follows the contour of n-type well diffusion 103. The deep n-well 104 forms an ohmic connection between the n material of the n-type well diffusion 103 and the n material of the substrate.

Integrated circuit 100 comprises a plurality of active devices, for example, PFETs 110 and 140, and NFETs 120 and 130. It is to be appreciated that integrated circuit 100 will typically comprise more than the four devices illustrated. NFET 120 is formed within an isolation tub 125 comprising P– epitaxial material that has been electrically isolated from other portions of the P– epitaxial layer by the combination of n-type well diffusion 103 and deep n-well 104. Within isolation tub 125, NFET 120 can be provided a body biasing voltage independent of other body biasing voltages applied to other devices outside of isolation tub 125. For example, a body biasing voltage can be provided to isolation tub 125 via P-tap 121.

It is to be appreciated that P-tap 121 need not be closely associated with NFET 120. An epitaxial layer, e.g., epitaxial layer 102, is highly conductive. Such conductivity is sufficient for coupling a body biasing voltage, e.g., from a single tap or a limited number of taps, to a plurality of NFETs within an isolation tub, e.g., isolation tub 125.

It is to be appreciated that it is sometimes desirable to form n-type field effect transistors, e.g., NFETs 120 and/or 130, in surface p-wells within a surface p-type epitaxial layer in order to obtain a desirable characteristic of such devices. For example, such an optional surface p-well (not shown) could be formed to include NFET 120 and p-tap 121. Embodiments in accordance with the present invention are well suited to such optional surface well structures.

It is appreciated that p-type field effect transistors are generally formed in n-type material. PFET 110 is formed within n-well 112. N-well 112 is formed within isolation tub 125 of p-type material. It is appreciated that n-well 112 is electrically isolated from other n-type material of integrated circuit 100, e.g., n-well 112 is electrically isolated from n-type well diffusion 103, deep n-well 104 and wafer substrate 101. For example, n-well 112 does not extend beyond a depth of epitaxial layer 102. Within n-well 112, PFET 110 can be provided a body biasing voltage independent of other body biasing voltages applied to other devices outside of n-well 112. For example, a body biasing voltage can be provided to n-well 112 via N-tap 111.

Isolation tub 125 can form a body-biasing domain. A body-biasing domain typically comprises a portion of circuitry of an integrated circuit, e.g., integrated circuit 100, typically comprising both n-type field effect transistors, e.g., NFET 120, and p-type field effect transistors, e.g., PFET 110. A body-biasing domain enables circuits within such a body-biasing domain, e.g., NFET 120 and/or PFET 110, to operate at body biasing voltages that are different from body biasing voltages utilized for other circuitry of an integrated circuit located outside of such a body-biasing domain. For example, NFET 120 and/or PFET 110 can operate with different body biasing voltage(s) than NFET 130 and/or PFET 140 of integrated circuit 100.

Still with reference to FIG. 1, NFET 130 is formed in epitaxial layer 102 of integrated circuit 100. Within epitaxial layer 102, NFET 130 can be provided a body biasing voltage. For example, a body biasing voltage can be provided to epitaxial layer 102 via P-tap 131. It is to be appreciated that P-tap 131 need not be closely associated with NFET 130. An epitaxial layer, e.g., epitaxial layer 102, is highly conductive. Such conductivity is sufficient for coupling a body biasing voltage, e.g., from a single tap or a limited number of taps, to a plurality of NFETs within an integrated circuit.

It is to be appreciated that this novel distribution of a body biasing voltage via an epitaxial layer can reduce a need for connection structures on a wafer surface, for example, tap and contact structures as well as metallization, utilized to distribute body biasing voltage(s) under the conventional art.

It is to be further appreciated that the distribution of a body biasing voltage via an epitaxial layer described herein is substantially lateral. For example, for an NFET in a conventional integrated circuit comprising a P-type substrate and a P-type epitaxial layer, the conduction of an applied or intrinsic body biasing voltage is substantially vertical, e.g., from the substrate vertically through the epitaxial layer to the body of the device. In contrast, an applied body biasing voltage, e.g., applied to P-tap 131, is conducted substantially laterally to NFETs, e.g., NFET 130.

PFET 140 is formed within n-well 145 within epitaxial layer 102. In contrast to n-well 112, n-well 145 is electrically coupled to a wafer substrate 101 via deep n-well via 146. A body biasing voltage can be coupled to n-well 145 from wafer substrate 101 via deep n-well via 146. It is to be appreciated that deep n-well via 146 serves as a via structure, in a manner analogous to well known vias between wiring levels of integrated circuit and/or printed wiring boards. It is to be further appreciated that this novel distribution of a body biasing voltage via a wafer substrate can reduce or eliminate a need for connection structures on a wafer surface, for example, tap and contact structures as well as metallization, utilized to distribute body biasing voltage(s) under the conventional art.

Deep n-well via 146 does not require a large vertical cross-sectional area, e.g., in plan view, in order to comprise suitable conduction characteristics, e.g., low resistance. For example, deep n-well via 146 is well suited to a small circular cross section as seen in plan view. It is appreciated that deep n-well via 146 is short in absolute terms, spanning only a distance from a bottom portion of n-well 145 to wafer substrate 101. Consequently, deep n-well via 146 can be substantially smaller than n-well 145 in length and/or breadth while retaining desirable conduction characteristics. A small size of deep n-well via 146 aids the lateral conductance of epitaxy layer 102 in a function of distributing a body biasing voltage to NFET 130. It is to be further appreciated that deep n-well via 146 does not form an isolating structure, e.g., a guard ring.

In accordance with an alternative embodiment of the present invention, a guard ring can comprise active devices. For example, n-type well diffusion 103 of FIG. 1 can be replaced with a structure similar to n-well 145 comprising PFET 140. It is to be appreciated that in such a case deep n-well via 146 may need to be replaced by a continuous structure such as deep n-well 104 to maintain isolation of isolation tub 125.

In accordance with still another embodiment of the present invention, an n-type tap into an n-well coupled to wafer substrate 101, e.g., n-tap 115 or a tap (not shown) into n-well 145, can optionally be constructed to provide a convenient tap through epitaxial layer 102 to wafer substrate 101.

Figure 2:
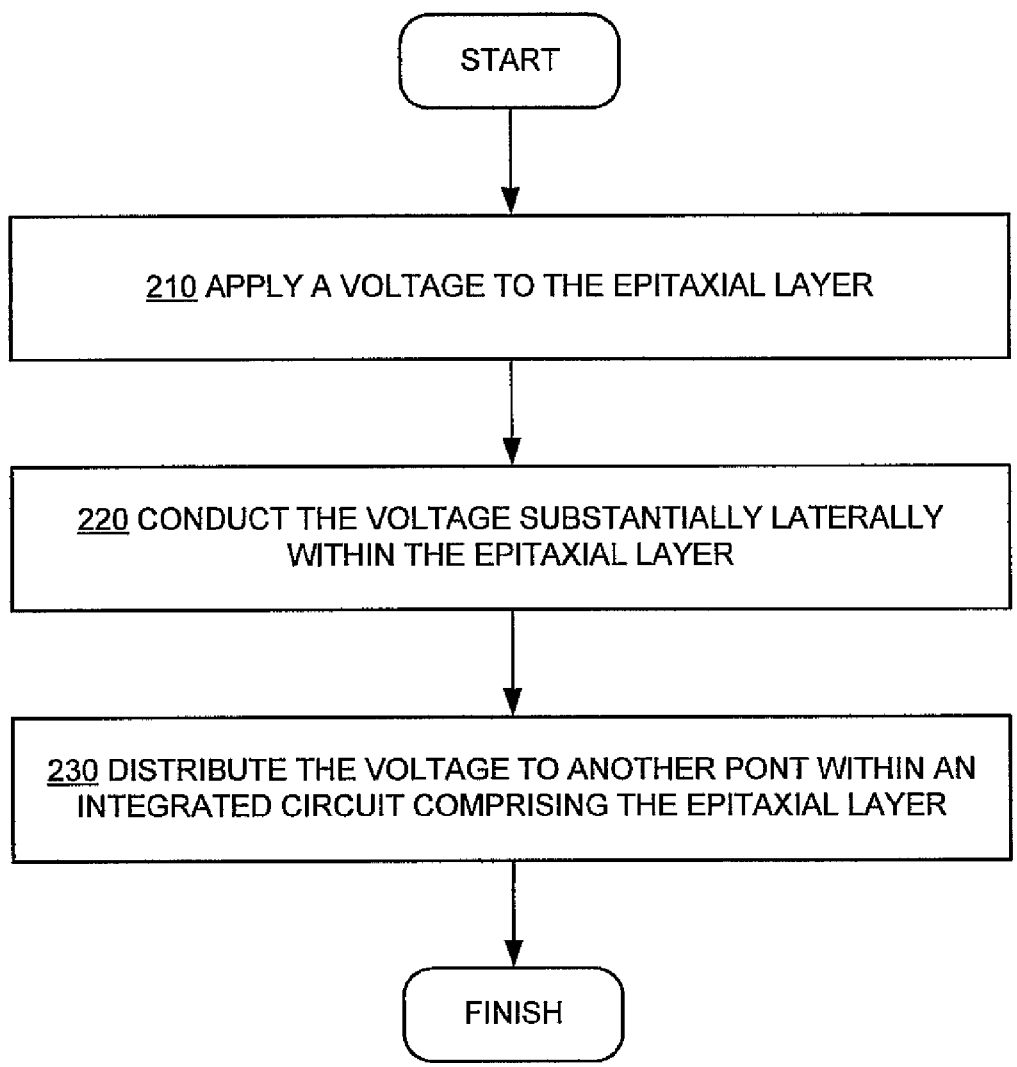
FIG. 2 illustrates steps in a method of voltage distribution via an epitaxial layer, in accordance with embodiments of the present invention.

FIG. 2 illustrates a method 200 of distributing voltage via an epitaxial layer, in accordance with embodiments of the present invention. In 210, a voltage, for example a body biasing voltage, is applied to the epitaxial layer. For example, a voltage can be applied to p-tap 131 of FIG. 1.

In 220, the voltage is conducted substantially laterally within the epitaxial layer. It is to be appreciated that, in general, conduction is primarily vertical within a conventional epitaxial layer disposed upon a substrate of similar connectivity, e.g., a p-type epitaxial layer disposed upon a p-type substrate. For example, conventionally, a voltage is conducted from a substrate through an epitaxial layer to devices near a semiconductor surface. In contrast, in accordance with embodiments of the present invention, conduction is substantially laterally within the epitaxial layer.

In 230, the voltage is distributed from the epitaxial layer, e.g., p-type epitaxial layer 102 (FIG. 1), to another point within an integrated circuit comprising the epitaxial layer, e.g., the body of NFET 130.

Embodiments in accordance with the present invention, systems and methods for voltage distribution via epitaxial layers, are thus described. While the present invention has been described in particular embodiments, it should be appreciated that the present invention should not be construed as limited by such embodiments, but rather construed according to the below claims.

What is claimed is:

1. An integrated circuit comprising:
   a wafer substrate of a first conduction type;
   an epitaxial layer of a second conduction type;
   a plurality of wells of the first conduction type disposed within said epitaxial layer;
   a plurality of deep wells of said first conduction type, wherein at least one of said plurality of deep wells couples at least one of said plurality of wells to said wafer substrate and another of said plurality of deep wells couples another of said plurality of wells to said wafer substrate;
   a first tap of said second conduction type disposed within at least a first portion of said epitaxial layer for coupling a first body biasing voltage to at least a first portion of said epitaxial layer; and
   a second tap of said first conduction type disposed within said one of said plurality of wells for coupling a second body biasing voltage to said another of said plurality of wells through said one and said another of said plurality of deep wells and said substrate layer.

2. The integrated circuit of claim 1 wherein said second body biasing voltage is conducted substantially vertically within saidl plurality of deep wells.

3. The integrated circuit of claim 1 further comprising:
   a first plurality of field effect transistors formed in said epitaxial layer;
   a second plurality of field effect transistors formed in said another of said plurality of wells.

4. The integrated circuit of claim 1 wherein said first body biasing voltage is conducted substantially laterally within said epitaxial layer.

5. The integrated circuit of claim 1 further comprising a region of said epitaxial layer electrically isolated from other portions of said epitaxial layer.

6. The integrated circuit of claim 5 further comprising:
   said one of said plurality of deep wells couples said one of said plurality of wells to said substrate to form an isolation structure of an isolation tub portion of said epitaxial layer;
   a third plurality of field effect transistors formed in said isolation tub; and
   a fourth plurality of field effect transistors formed in at least one of said plurality of wells in said isolation tub.

7. The integrated circuit of claim 6 further comprising:
   a third tap of said second connection type coupling a third body biasing voltage to said isolation tub portion of said epitaxial layer; and
   a fourth tap of said first connectivity type coupling a fourth body biasing voltage to said at least one well in said isolation tub.

8. The integrated circuit of claim 7, wherein said first and second body biasing voltages forms a first body biasing domain and said third and fourth body biasing voltages form a second body biasing domain different from said first body biasing domain.

9. An integrated circuit comprising:
   a first plurality of field effect transistors formed in an epitaxial layer of a first conduction type;
   a second plurality of field effect transistors formed in a first well of second conduction type opposite said first conduction type, said well disposed within said epitaxial layer;
   a layer of said second conduction type disposed beneath said epitaxial layer; and
   a deep well of said second conduction type for coupling a first body biasing voltage from a second well of said second conductivity type disposed within said epitaxial layer through said layer to said second plurality of field effect transistors wherein said deep well does not form an isolating structure.

10. The integrated circuit of claim 9 further comprising a tap of said first conduction type formed in said epitaxial layer for coupling a second body biasing voltage to said first plurality of field effect transistors.

11. The integrated circuit of claim 10 wherein conduction of said second body biasing voltage is substantially lateral within said epitaxial layer.

* * * * *